(12) United States Patent
Neel et al.

(10) Patent No.: US 8,569,151 B2
(45) Date of Patent: Oct. 29, 2013

(54) METHOD OF FORMATION OF NANOWIRES AND METHOD OF MANUFACTURE OF ASSOCIATED OPTICAL COMPONENT

(75) Inventors: Delphine Neel, Venissieux (FR); Pierre Ferret, Grenoble (FR); Stéphane Getin, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 224 days.

(21) Appl. No.: 13/147,081

(22) PCT Filed: Jan. 28, 2010

(86) PCT No.: PCT/EP2010/051012
§ 371 (c)(1),
(2), (4) Date: Oct. 10, 2011

(87) PCT Pub. No.: WO2010/086378
PCT Pub. Date: Aug. 5, 2010

(65) Prior Publication Data
US 2012/0021554 A1    Jan. 26, 2012

(30) Foreign Application Priority Data

Jan. 30, 2009    (FR) ..................... 09 50573

(51) Int. Cl.
*H01L 21/20*    (2006.01)
*H01L 21/36*    (2006.01)
*G01J 1/00*    (2006.01)
*A61N 5/00*    (2006.01)

(52) U.S. Cl.
USPC ............. 438/478; 250/491.1; 250/492.2; 977/762; 977/890; 977/901

(58) Field of Classification Search
None
See application file for complete search history.

(56) References Cited

U.S. PATENT DOCUMENTS

| 7,335,908 B2 * | 2/2008 | Samuelson et al. ............. 257/12 |
| 2004/0036976 A1 * | 2/2004 | Grier et al. .................... 359/614 |
| 2004/0079278 A1 | 4/2004 | Kamins et al. |
| 2004/0082178 A1 | 4/2004 | Kamins et al. |

(Continued)

FOREIGN PATENT DOCUMENTS

| FR | 2924855 A1 * | 6/2009 |
| GB | 2 436 449 A | 9/2007 |
| WO | WO 2004/004927 A2 | 1/2004 |

OTHER PUBLICATIONS

French Preliminary Search Report issued Jul. 3, 2009, in Patent Application No. 0950573.

(Continued)

*Primary Examiner* — Evan Pert
*Assistant Examiner* — Andres Munoz
(74) *Attorney, Agent, or Firm* — Oblon, Spivak, McClelland, Maier & Neustadt, L.L.P.

(57) ABSTRACT

A method of formation of nanowires at a surface of a substrate attached to a solid immersion lens. The method includes formation of a catalyst element at the surface of the substrate and growth of nanowires from the catalyst element formed at the surface of the substrate. The catalyst element is a metal nanoparticle and the formation of the catalyst element at the surface of the substrate deposits the metal nanoparticle using a light beam focused by the solid immersion lens at the surface of the substrate.

11 Claims, 8 Drawing Sheets

(56) References Cited

U.S. PATENT DOCUMENTS

| | | |
|---|---|---|
| 2005/0112048 A1* | 5/2005 | Tsakalakos et al. .......... 423/439 |
| 2005/0122550 A1 | 6/2005 | Plewa et al. |
| 2005/0151126 A1 | 7/2005 | Yamakawa et al. |
| 2006/0286023 A1* | 12/2006 | Huang ...................... 423/447.1 |
| 2007/0069119 A1* | 3/2007 | Appleyard et al. ........... 250/251 |
| 2008/0190756 A1* | 8/2008 | Getin et al. .............. 204/157.15 |
| 2008/0191317 A1 | 8/2008 | Cohen et al. |
| 2008/0296785 A1 | 12/2008 | Kamins et al. |
| 2008/0315175 A1* | 12/2008 | Pauzauskie et al. ............ 257/12 |

OTHER PUBLICATIONS

Yi Cui, et al., "Diameter-controlled synthesis of single-crystal silicon nanowires", Applied Physics Letters, vol. 78, No. 15, XP 2535075, Apr. 9, 2011, pp. 2214-2216.

Maria Dienerowitz, et al., "Optical manipulation of nanoparticles: a review", Journal of Nanophotonics, vol. 2, No. 021875, XP 40447263, Sep. 10, 2008, pp. 1-31.

* cited by examiner

METHOD OF FORMATION OF NANOWIRES AND METHOD OF MANUFACTURE OF ASSOCIATED OPTICAL COMPONENT

TECHNICAL FIELD AND PRIOR ART

The invention concerns a method of formation of nanowires at the surface of a substrate and, more particularly, a method of formation of nanowires at the surface of a substrate attached to the flat face of a solid immersion lens.

The invention also concerns a method of manufacture of an optical component which includes a step of formation of nanowire in accordance with the method of formation of nanowire of the invention.

The invention applies to nanowire manufacturing technologies such as, for example, bottom-up technology. The fields concerned by the invention are those of microelectronics, lighting, photovoltaics, etc.

There are different methods of growing nanowires. Among the best-known is the VLS method (VLS for "Vapour-Liquid-Solid"), which uses a metal catalyst. The metal most commonly used as a catalyst is gold, due to the low eutectic temperature of the gold-silicon blend, which is only 363° C. Gold therefore allows growth at relatively low temperature. It is also possible to use, for example, nickel, copper, platinum, silver or palladium. However, these metals require the use of much higher temperatures. It is also possible to use nickel, titanium or aluminium.

The VLS method uses metal islands, generally gold, as catalysts for the growth of the nanowires. The islands are obtained by depositing metal colloids on a substrate or by dewetting of a thin metal layer.

Gold colloids (particles of diameter less than 100 nm) are deposited on the surface of a semiconductor wafer. The substrates are placed in an apparatus, where the colloids are heated to their melting point. Precursor gases are introduced into the apparatus, causing semiconductor saturation in the metal drop. Crystalline growth occurs at the liquid-solid interface by precipitation. The diameter of the nanowires is determined by the size of the drop of metal-semiconductor alloy, which is itself determined by the original size of the gold colloids. Use of gold colloids allows better control of the diameter of the wires than use of a thin metal layer.

Dewetting of a thin metal layer consists of evaporating a thin metal film having a thickness of several nanometers, followed by annealing to form the metal islands of nanometric size. When the islands have been formed the growth mechanism is the same as with colloids. With this technique the size dispersion of the drops is substantial, which influences the diameter of the wires after growth. In addition, the positions of the drops are random.

Certain nanowires, such as nanowires made of ZnO or $Ga_2O_3$, can grow without any metal catalyst. The growth method is then the VS ("Vapour-Solid") method. For example, in the case of ZnO, growth of the nanowires is obtained by thermal evaporation of a ZnO metal powder.

Certain methods of growing nanowires also involve precise positioning of them. According to a first of these methods, a layer of resin deposited on a semiconductor substrate is imaged by photolithography or by electron-beam lithography (commonly called e-beam lithography). A thin layer of gold is then deposited on the sample, and the resin is then removed. This leaves a pattern consisting of a network of gold studs. Growth of the wires is then accomplished traditionally by the abovementioned VLS method. The wires produced in this manner are completely perpendicular to the substrate, and have great regularity in terms of size, diameter, position and uniformity. The imaged zones can be as large as several square centimeters. Positioning accuracy is approximately 8 to 10 nm in the case of electron-beam lithography, and depends on the wavelength used in the case of optical lithography. The advantages of such a method are that accuracy of positioning of the nanowires is obtained, and it is possible to produce any type of pattern. There are, however, many disadvantages, namely the cost and complexity of the equipment required for implementing the method (for example the cost of the masks for optical lithography).

According to a second method, a resin layer is deposited on a silicon substrate. A pattern consisting of a network of holes is imaged in the resin by electron-beam lithography. The silicon is etched, in the holes in the resin, by reactive-ion etching. A metal layer is then deposited on the sample by evaporation. The metal layer is therefore deposited on top of the resin and at the bottom of the hole. The metal layer above the resin is then removed. Finally, the growth of the nanowires is accomplished by a traditional VLS method, as mentioned above, with the metal island located at the bottom of the hole acting as a catalyst. The wires produced using this method have uniform diameter and length, but also have several crystallographic faults. The advantage of this other method also lies in the satisfactory accuracy obtained in positioning the nanowires. The cost and complexity of the equipment are, however, real disadvantages, as is the situation occupied by the nanowires, which are located in holes.

According to a third method, a single layer of polystyrene beads is deposited on a silicon substrate, and self-organises into a regular pattern. RIE etching ("Reactive Ion Etching", i.e. plasma etching) enables the size of the beads to be reduced to colloidal size. A layer of silver is deposited on the assembly formed by the beads and the substrate. Etching in hydrochloric acid and $H_2O_2$ enables the silicon to be etched under the layer of silver. The silver is then removed by an etching in nitrohydrochloric acid and the beads are removed by an etching in hydrochloric acid. A set of wires distributed according to an organised pattern is then obtained. The advantage of this third method is that satisfactory regularity of the pattern is obtained; the disadvantage lies in the inability to produce random patterns.

A fourth method consists in using AFM (Atomic Force Microscopy) points or microscope points with atomic force for producing the nanowires. Gold colloids are firstly deposited on a silicon substrate using an aerosol. An AFM point in contact mode is then used to push the colloids and move them to the desired positions. The growth of the nanowires is then accomplished by traditional methods. The advantages of this method are very great positioning accuracy (of the order of one nanometer) and the fact that any pattern can be produced. The disadvantages are the slow speed of movement of the AFM point, the fact that a single colloid is manipulated at once, and the fact that the method cannot be used if the surface of the silicon substrate has substantial changes of topography.

A fifth method uses nanopores. The nanopores are formed by anodisation of an aluminium membrane. The nanopores obtained are self-organised into a network of uniform diameter and depth. The membrane is deposited on a semiconductor substrate. A metal layer is deposited by evaporation on the substrate. The metal at the surface is removed. A network of metal studs therefore remains at the bottom of the nanopores. The growth of the nanowires then occurs by the VLS method. One advantage is the regularity of the pattern. The disadvantages are that random patterns cannot be produced, and that the nanowires are in holes.

A sixth method concerns lithography by nano-imprinting. A mould made from polydimethylsiloxane (PDMS) covered with an "ink" made of poly-L-lysine is applied to the surface of a silicon substrate. In the contact zones the poly-L-lysine is transferred to the silicon. The substrate is then immersed in a solution containing gold colloids. The colloids are attached only to the zones covered with poly-L-lysine and not to the bare substrate. The growth of the wires is then accomplished by the VLS method. A major disadvantage of such a method is the cost of the mould.

Manufacture of optical components including a solid immersion lens coupled with a nanowire is also known in the prior art.

The solid immersion lens is firstly produced. On the flat part of the lens a twin layer of semiconductor material (for example Si or ZnO) and of precursors (for example Au) is then deposited. The twin layer is etched such that it remains only in the centre of the lens. The etching width is somewhere between ten and one hundred nanometers Using any one of the abovementioned techniques, a catalyst element is then formed at the surface of the etched twin layer, and a nanowire is grown from the catalyst element. This method of manufacturing an optical component has a major difficulty, namely the centring of the etched twin layer on the lens. Decentring of the order of magnitude of the diameter of the nanowire (for example few tens to a few hundreds of nanometers) is sufficient, when the optical component has been completed, for it no longer to be possible to couple in the nanowire the light injected in the lens.

The method of the invention does not have the abovementioned disadvantages of the methods of the prior art.

ACCOUNT OF THE INVENTION

Indeed, the invention concerns a method for forming nanowires on the surface of a substrate attached to a flat face of a solid immersion lens, where the method includes a step of formation of at least one catalyst element at the surface of the substrate, and a step of growth of nanowires from each catalyst element formed at the surface of the substrate. Since the catalyst element is a metal nanoparticle, and since the substrate is transparent at an operating wavelength, the step of formation of a catalyst element at the surface of the substrate includes the following successive steps:

bringing the substrate into contact with a fluid placed in a tank which contains metal nanoparticles, focusing of a light beam at the operating wavelength in the area of the substrate, using an incident light beam on a hemispherical face of the solid immersion lens, moving the tank until a metal nanoparticle is trapped in the focused light beam, and attaching the trapped metal nanoparticle on the substrate.

According to an additional characteristic of the invention, since the fluid is a liquid which fills the tank, once the metal nanoparticle is attached to the substrate the tank is disassembled and the substrate is dried during a drying step.

According to another additional characteristic of the invention, since the fluid is air which fills the tank, the nanoparticles are introduced into the tank using an atomiser and, once the nanoparticle is attached to the substrate the tank is disassembled.

According to yet another additional characteristic of the invention, the metal nanoparticle is attached by fusion to the surface of the substrate.

According to yet another additional characteristic of the invention, the substrate is firstly covered with a surface treatment able to facilitate the attachment of the nanoparticle to the substrate.

According to yet another additional characteristic of the invention, the surface treatment is a treatment using poly-L-lysine or a treatment by aminosilane.

According to yet another additional characteristic of the invention, the surface treatment is removed before the step of growth of the nanowires.

According to yet another additional characteristic of the invention, the surface treatment is removed after the step of growth of the nanowires.

The invention also concerns a method of manufacture of an optical component including a solid immersion lens and at least one nanowire coupled to the solid immersion lens. The formation of the nanowire on the solid immersion lens is accomplished using the nanowire formation method of the invention.

The optical component obtained by the method of manufacture of the invention can, for example, be incorporated in a close-field detection device intended to irradiate an object with radiation, and to collect the radiation reflected by this object. The optical component obtained by the method of the invention can be, for example, a head for reading or writing optical data onto an optical data medium, or again a close-field optical microscope probe.

The method of formation of nanowires of the invention uses an optical trap to convey and deposit metal particles (generally nanoshells) on the surface of a semiconductor substrate attached on a solid immersion lens. The metal particles are then used as catalysts for the growth of nanowires by the known methods such as, for example, the VLS method. The metal particles, and consequently the nanowires, are advantageously positioned with an accuracy of the order of some ten nanometers. Advantageously, for the production of an optical component fitted with a solid immersion lens coupled with a nanowire, the solid immersion lens forming part of the optical component participates in the formation of the nanowire. The problem of centring of the nanowire is substantially improved by this means.

The optical trap is produced using a refractive optics device which creates, from a light beam, a highly concentrated light beam. The light beam may be, for example, a laser beam. A particle located in the area of the highly concentrated light beam is subjected to forces called "gradient forces" which attract the particle to the maximum intensity of the light beam, which maximum is located in the most confined zone of the beam. The diameters of the trapped particles range from some ten microns to some ten nanometers. Generally, the particles which it is possible to move using an optical clip are of very different natures, namely dielectric, metal, semiconductor, biological, polymeric, etc. particles. In the context of the invention the particles are metal particles.

The particles are generally dissolved in deionised water, but it is also possible to use other solvents such as, for example, ethanol. The solvent must have a refraction index less than that of the particle, a viscosity close to that of water, and it must not modify the surface condition of the particle.

The light beam is preferentially a laser beam. The choice of the wavelength of the laser used to form the optical clip depends on the nature of the particles to be trapped. Indeed, the particles placed in the laser flux are subjected to two types of optical forces: the gradient forces, which are attractive, and convey the particles to the most concentrated zone of the laser beam, and the absorption and diffusion forces, which are repulsive and which push the particles in the laser beam's direction of propagation, which tends to destabilise the clip. For trapping to be possible the gradient forces must be very much greater than the absorption and diffusion forces. Thus, the wavelength of the laser must correspond to a minimum of absorption and of diffusion by the particle. In the case of gold particles, use of a 532 nm laser is avoided since this wavelength corresponds to a diffusion maximum by gold.

According to the preferential embodiment of the invention, the metal particles used are gold particles of diameter typically ranging from some ten nanometers to approximately 250 nm or silver particles of diameter typically ranging from approximately 20 nm to 275 nm.

In the current state of particle-trapping technique, particles of greater diameter cannot be trapped with an optical trap with a single gaussian beam. An alternative is then to use two counter-propagating laser beams, i.e. the propagation directions of which are opposite, focused at the same point. It is also possible to work with a single beam, but the central part of which is darkened. In this latter case the particles are trapped by repulsion using a light toroid.

BRIEF DESCRIPTION OF THE FIGURES

Other characteristics and advantages of the invention will appear on reading the preferential embodiments described in reference to the attached figures, among which.

In all the figures the same references designate the same elements.

DETAILED ACCOUNT OF PARTICULAR EMBODIMENTS OF THE INVENTION

Figure 1A:
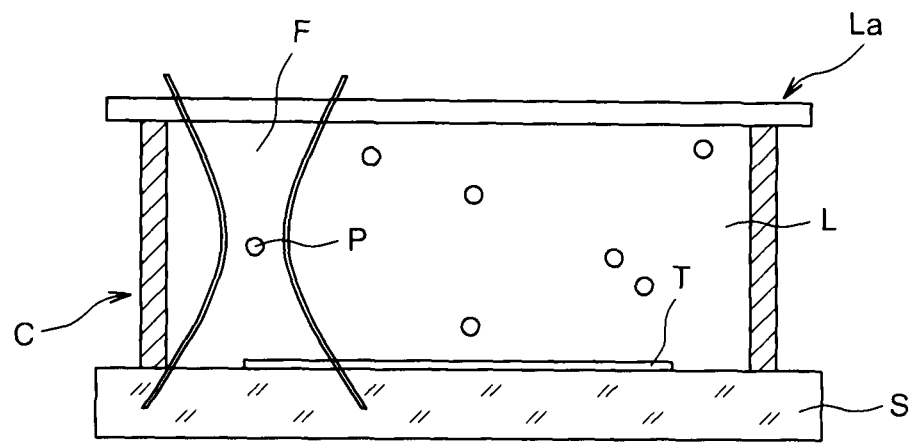
FIGS. 1A-1F represent successive steps of a method for positioned growth of nanowires on a substrate.
Figure 1B:
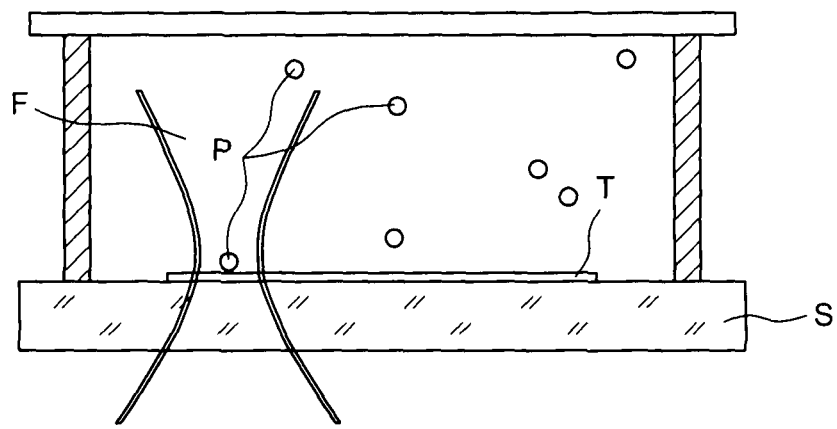
Figure 1C:
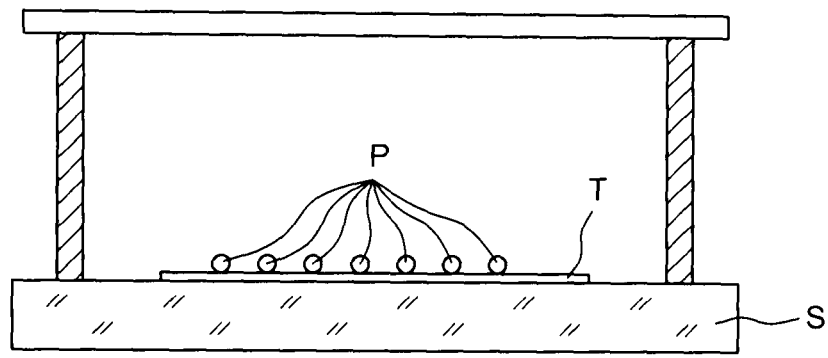
Figure 1D:
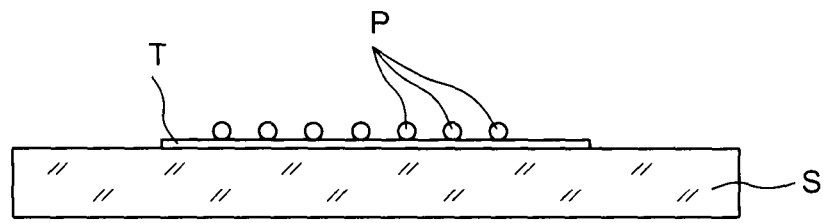
Figure 1E:
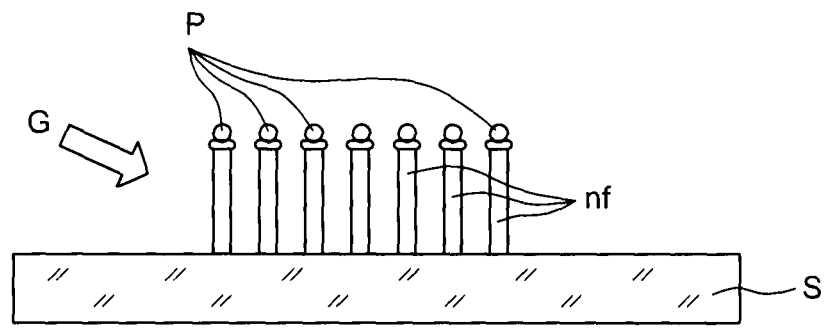
Figure 1F:
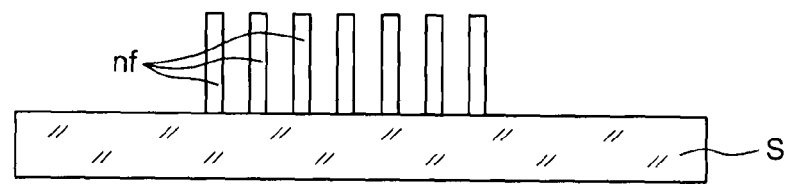

FIGS. 1A-1F represent successive steps of a method for positioned growth of nanowires on a substrate.

The optical clip is a light beam waist formed using a microscope objective the numerical aperture of which is greater than 1. The light beam from which the waist is formed is preferentially a laser beam.

Metal nanoparticles P are placed in a tank C containing a fluid, for example a liquid L. The bottom of the tank C consists of a semiconductor substrate S. A cover glass La constitutes, for example, a lid closing the tank. The face of the semiconductor substrate intended to be in contact with the liquid L has preferentially previously been cleaned by a known method, for example a method of the oxygen plasma treatment type. Also preferentially, a surface treatment T, for example a treatment using poly-L-lysine or treatment by aminosilane, covers the face of the semiconductor substrate which is in contact with the liquid in order to facilitate attachment of the particles. The optical clip is accomplished by the waist W of a highly concentrated light beam F. The optical clip enables the nanoparticles to be moved, one by one, as far as the surface of the substrate (cf. FIG. 1B). When a nanoparticle is positioned on the substrate it attaches to it due to the electrostatic forces present at the surface of the substrate (Van der Waals forces). If present, the surface treatment T facilitates this attachment. The nanoparticles then remain attached to the substrate even when there is no light beam. The step of displacement of nanoparticles is repeated for as many times as required in order to attach, in the desired spatial configuration, the desired quantity of particles (cf. FIG. 1C). The tank C is then removed and the residues of liquid L are evaporated, by drying, whilst controlling the temperature and pressure conditions (cf. FIG. 1D). As a non-restrictive example, the drying temperature may thus be equal to 35° C., and the pressure equal to 1 atmosphere. The semiconductor substrate S is then positioned in a growth apparatus (not represented in figures) and precursor gases G are introduced into the apparatus in order to initiate a process, known per se, for growth of the nanowires. The precursor gases are, for example, nitrous oxide $N_2O$, or diethylzinc in the case of zinc oxide ($Z_nO$) nanowires, and silane $SiH_4$ in the case of silicon nanowires (Si). When the growth of the nanowires of is complete (cf. FIG. 1E), the metal nanoparticles P and the surface treatment T, if present, are removed, for example by chemical etching (cf. FIG. 1F).

Compared to the known techniques for positioning nanowires the method has the following advantages:
 The method does not include any costly technological step such as, for example, lithography;
 The metal nanoparticles can be positioned in any place of the surface of the substrate and in any pattern;
 The accuracy with which the nanoparticles are positioned is of the order of some ten nanometers;
 The technique of the invention is fast, for example more rapid than the abovementioned AFM technique.

In the context of the invention the abovementioned surface treatment T designates a single layer of organic molecules of a thickness of a few nanometers. The choice of organic molecules is appropriate for the nature of the nano-objects to be created, and for the nature of the substrate S. As a non-restrictive example, as previously mentioned, the surface treatment is a treatment using poly-L-lysine.

Figure 2:
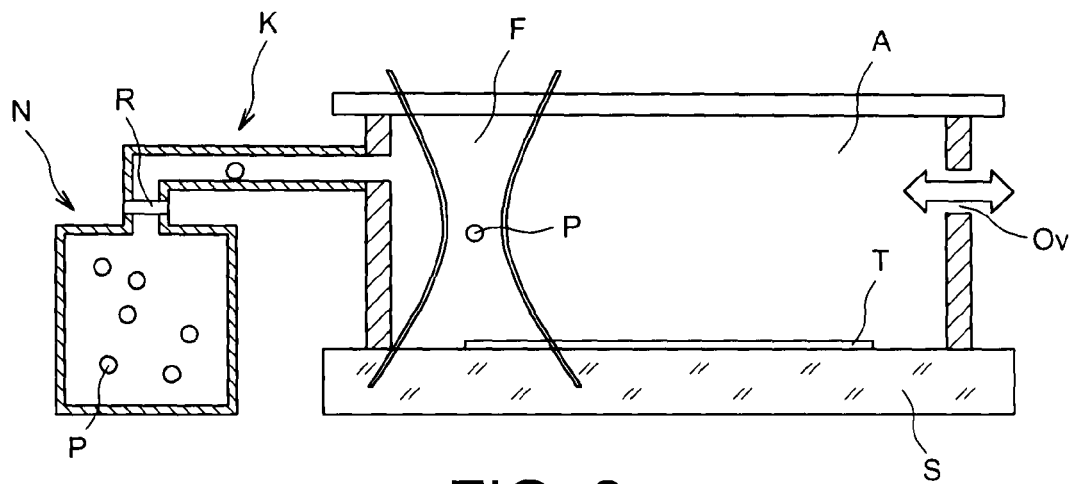
FIG. 2 represents an example of a device which implements the method of positioned growth of nanowires described in FIGS. 1A-1F.

FIG. 2 represents an example of a device which implements the method of growth of nanowires illustrated in FIGS. 1A-1F.

According to this example the fluid which fills the tank C is not a liquid but air A. Advantageously, it is then not necessary to dry the substrate S at a later stage. The metal nanoparticles P are suspended in the air which fills the tank C using an aerosol. To create the aerosol an atomiser N is used, for example, fitted with a network R of holes, agitated by ultrasound. The nanoparticles P are suspended in a solvent, for example ethanol, which fills the atomiser's tank. The nanoparticles P have a diameter less than the size of the holes, in order that they are able to traverse the network. An aperture in the exterior Ov is made in the tank C. The Ov aperture allows rapid evaporation of the solvent before a nanoparticle P which has entered into the tank arrives in the waist W of the beam F. The nanoparticles are thereby trapped in the air. When the nanoparticles P have been deposited on the substrate S, the method of growth of nanowires is in accordance with the previously described method, except for the step of drying of the substrate, which in this case is advantageously unnecessary, as was mentioned above.

Figure 3A:
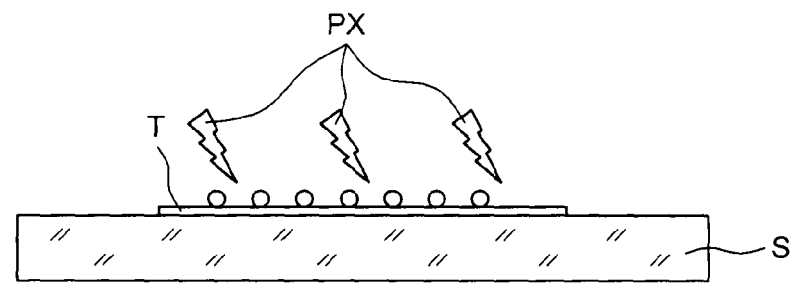
FIGS. 3A-3B represent two steps of a variant of the method of positioned growth of nanowires represented in FIGS. 1A-1F.
Figure 3B:
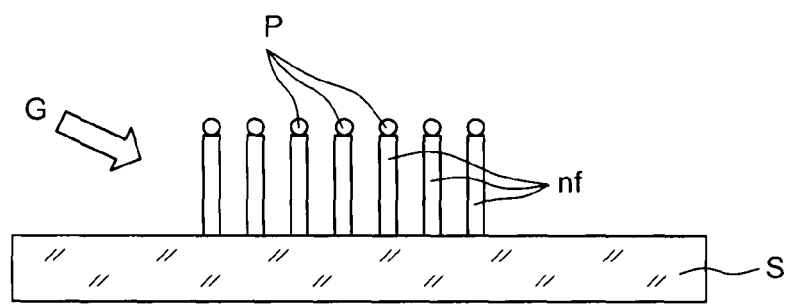

FIGS. 3A-3B represent two steps of a variant of the method illustrated in FIGS. 1A-1F.

According to this variant the surface treatment T layer is removed before the growth of the nanowires, for example with a treatment under oxygen plasma PX. The surface treatment layer T is, in fact, a potentially contaminating layer between the substrate S and the metal nanoparticles P. Removal of the treatment layer T thus prevents all contamination and also allows a more uniform growth of the nanowires. It is thus possible to obtain nanowires the verticality of which relative to the substrate is very appreciably improved compared to a situation in which the layer T is retained during the growth of the nanowires (cf. FIG. 3B).

Figure 4:
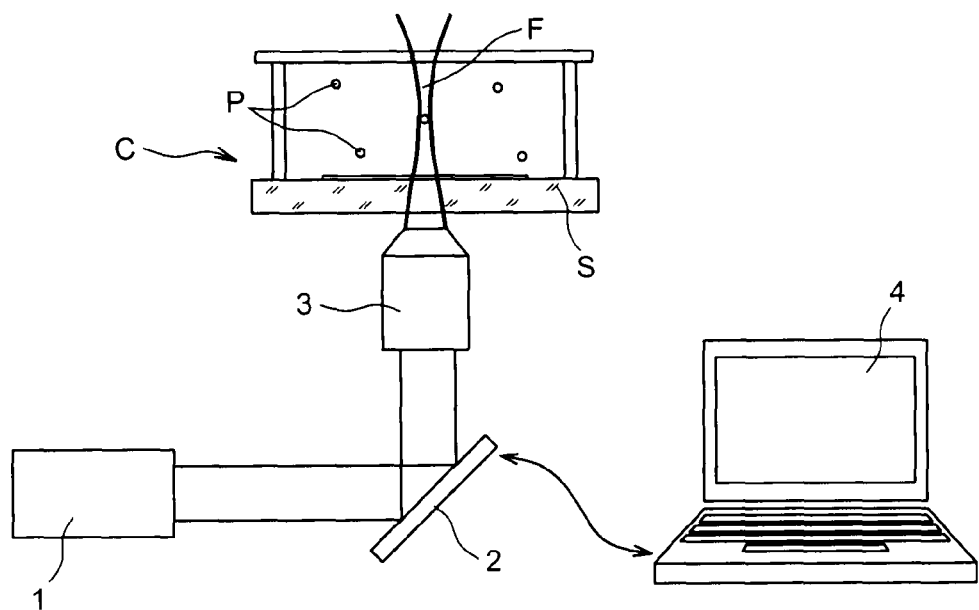
FIG. 4 represents a first example of a device which implements the method of positioned growth of nanowires described in FIGS. 1A-1F.

FIG. 4 represents a first example of a device which implements the method of positioned growth of nanowires.

According to this variant, several light beams are used simultaneously to create a multi-beam optical clip. The multi-beam optical clip is created, in a manner known per se, by inserting an optical component 2 between the single light beam delivered by an optical source 1 and the tank C. The optical component 2 is, for example, a diffractive component, a holographic component or a component consisting of one or more spatial light modulators. By this means several light beams are generated, for example as many as two hundred beams, which are focused by the same lens 3 in the tank C. Multiple light beam waists are then formed in the tank C. The optical component 2 may be controlled, for example by a computer 4.

Figure 5:
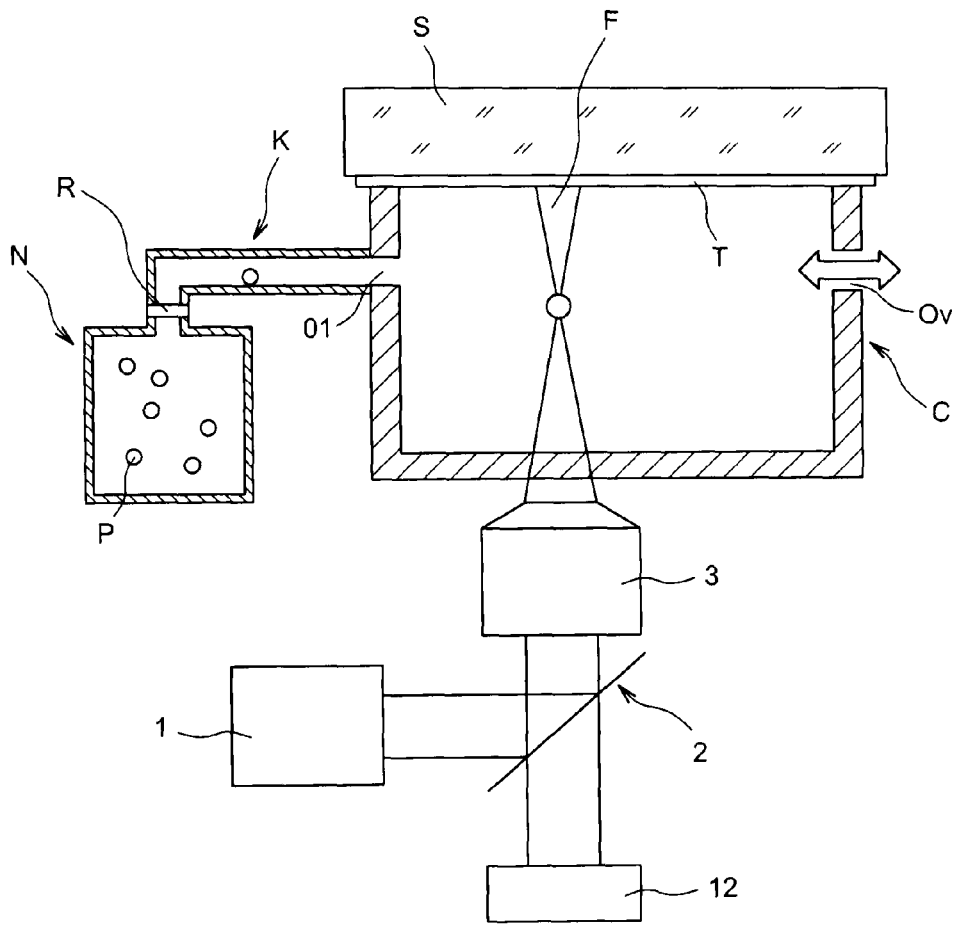
FIG. 5 represents a second example of a device which implements the method of positioned growth of nanowires described in FIGS. 1A-1F.

FIG. 5 illustrates a second example of a device which implements the method of positioned growth of nanowires.

Gold colloids P of diameter 50 nm are dissolved in ethanol. The colloids solution is placed in the tank of an atomiser N which enables the metal particles to be diffused in aerosol form. A thin layer T of poly-L-lysine is deposited on the surface of a microcrystalline silicon wafer S, to facilitate satisfactory attachment of the colloids to the surface. The walls of the tank C made of PDMS (Polydimethylsiloxane) are attached to the face of the wafer covered with the thin layer T. The tank is transparent at the wavelength of the laser used to produce the optical clip. The tank has a first aperture 01 in one side, in which is inserted the end of the fluid channel K. The fluid channel K connects the tank to the atomiser. The tank also has a second aperture 0$v$ which establishes a communication between the air present inside the tank and the outside air. The "tank+substrate" assembly is placed in the sample-holder of an inverted microscope. The microscope includes an immersion lens 3 having a numerical aperture of 1.25. This lens is used both for producing the optical clip and for observing the sample. A CCD camera 11 is placed behind the microscope lens for viewing the sample. The optical clip is produced by injecting in the lens 3 the light derived from a YAG laser 1 emitting, at wavelength 1064 nm, a power rating of 100 mW. The optical clip is first positioned, inside the tank, in the area of the output of the fluid channel, to await the arrival of a particle originating from the channel. When a particle is trapped, the operator (or a computer application) moves the optical clip and/or the tank in such a way as to place the particle at the desired position on the surface of the wafer. When the laser 1 has been turned off, the particle remains attached to the surface, due to the poly-L-lysine. The process is repeated for as many times as required. The PDMS tank is then separated from the sample. The substrate is cleaned under oxygen plasma, and then placed in the chamber of an LPCVD (Low Pressure Chemical Vapour Deposition) apparatus. The growth of the nanowires takes place by the VLS (Vapour-Liquid-Solid) method, by introducing silane ($SiH_4$) into the apparatus, at a rate of between 10 and 30 sccm and with a growth temperature of between 400 and 650° C.

Figure 6A:
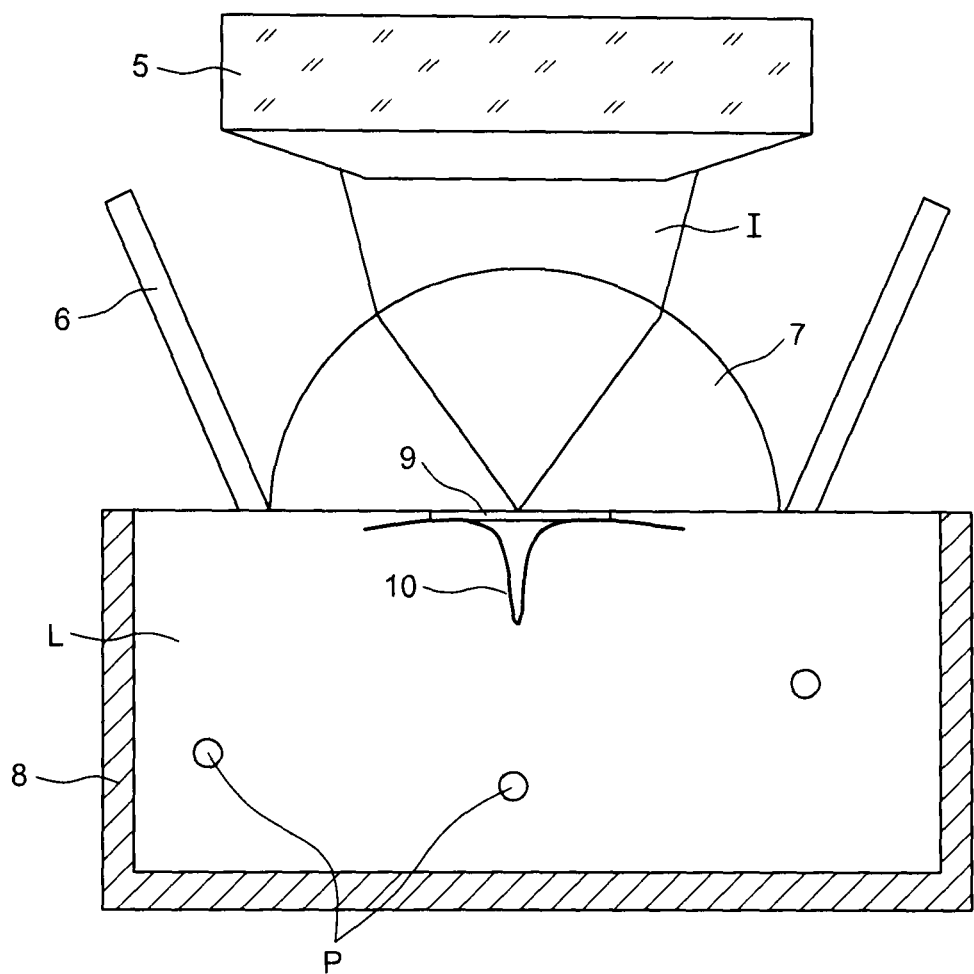
FIGS. 6A-6C represent an example of positioned growth of nanowires on a solid immersion lens in accordance with the invention.
Figure 6B:
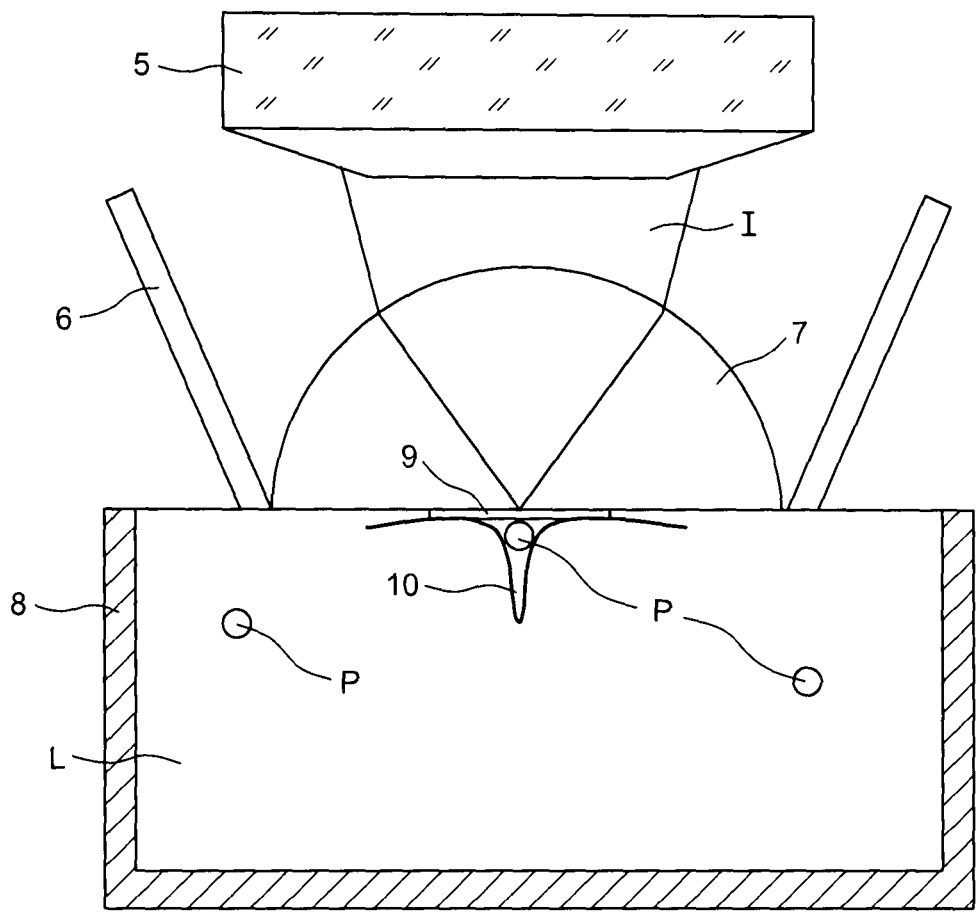
Figure 6C:
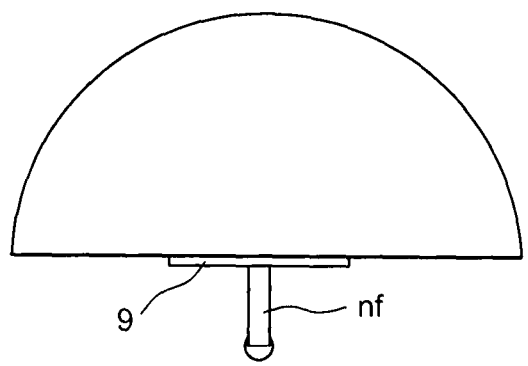

FIGS. 6A-6C represent steps of an example of method for positioned growth of nanowires according to the invention. According to the invention, an optical clip is produced using a light beam which is highly focused by a solid immersion lens.

A solid immersion lens is a lens, preferentially of hemispherical shape, which is manufactured using a material with a high refraction index n ($2 \leq n$). Use of such a lens enables the numerical aperture of the optical system to be increased and, by this means, the size of the focusing point to be reduced by a factor $1/n$ compared to the resolution limit in air.

The device which implements the method of the invention thus includes a solid immersion lens 7 on the flat face of which a layer of a semiconductor material 9 is deposited. The layer of semiconductor material 9 is transparent at the operating wavelength and has a thickness which is small compared to this wavelength. The lens/layer assembly of semiconductor material is partially placed in a tank 8 filled with a liquid L which contains the metal particles P. The flat face of the lens 7 covered with the semiconductor layer is brought into contact with the liquid, with the remainder of the lens located outside the tank. The face of the semiconductor material in contact with the liquid L can be covered with the same surface treatment T (poly-L-lysine) as that described above. The lens is lit, on the hemispherical side, using a focused light beam I emanating from a microscope lens 5 with a low numerical aperture. A support 6 enables the lens 7 to be kept in contact with the liquid L. The tank 8 is moved until a particle P is positioned close to the centre of the lens 7. The light focused around the lens/layer assembly of semiconductor material is used in this case as an optical clip to trap the particle in the same way as the abovementioned optical clip's laser beam waist. Once the particle P is in contact with the layer 9 the particle P is attached to the layer 9 by electrostatic force. This attachment by electrostatic force depends on the surface condition of the particle and on the surface condition of the substrate. In FIGS. 6A and 6B reference 10 represents, symbolically, the light intensity at the focus of the lens 7.

A step of growth of nanowire of then follows the attachment of the particle P to the substrate (cf. FIG. 6C).

Figure 7:
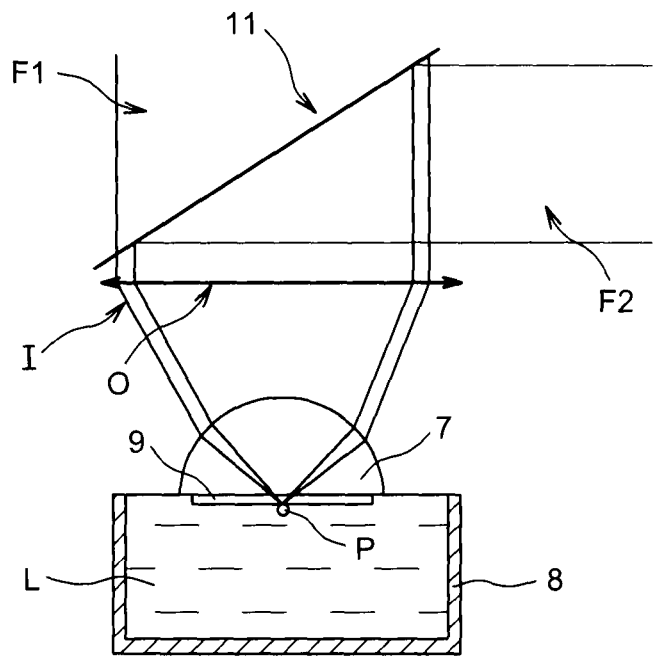
FIG. 7 represents, as an example, a particular step of the method of positioned growth of nanowires on a solid immersion lens in accordance with the invention.

FIG. 7 represents, as an example, a particular step of a variant of the method of positioned growth of nanowire of the invention.

According to this particular step, the metal nanoparticles are attached by fusion to the surface of the layer of semiconductor material 9. In addition to the light beam F1 which creates the optical clip, a laser beam F2, for example a laser beam of the Ultra Violet (UV) pulse type, is also focused on the layer of semiconductor material 9. Beams F1 and F2 are then injected, via a semi-reflective blade 11, in the same microscope objective Ob with high numerical aperture. A metal nanoparticle P, which is conveyed and deposited on the layer of semiconductor material 9 using the optical clip, is then welded on this same layer using the focused pulse UV laser beam.

According to the preferential embodiment of the invention described with reference to FIGS. 6A-6B and 7, a single nanoparticle P is attached to layer 9. The invention concerns, however, other embodiments in which several nanoparticles are attached on layer 9. Several nanoparticles are then trapped in the same focused beam.

For reasons of convenience, in the above description, the term "nanoparticle" is used to designate, generally, all particles of small dimensions, able to be positioned, as a catalyst, on the substrate. The term "nanoparticle" must not, of course, be understood as an object with dimensions exclusively of the order of a few nanometers. The dimensions of the "nanoparticles" can thus be between several nanometers and several tens of micrometers.

The invention claimed is:

1. A method of formation of nanowires at a surface of a substrate attached to a flat face of a solid immersion lens, the method comprising:
    forming at least one catalyst element at the surface of the substrate; and
    growing nanowires from each catalyst element formed at the surface of the substrate, wherein, with the catalyst element being a metal nanoparticle and with the substrate being transparent at an operating wavelength,
    the forming the catalyst element at the surface of the substrate includes:
        bringing the substrate into contact with a fluid placed in a tank that contains metal nanoparticles;
        focusing a light beam at the operating wavelength in an area of the substrate, using an incident light beam on a hemispherical face of the solid immersion lens;
        moving the tank until a metal nanoparticle is trapped in the focused light beam; and
        attaching the trapped metal nanoparticle on the substrate.

2. A method of formation of nanowires according to claim 1, in which, with the fluid being a liquid that fills the tank, once the metal nanoparticle is attached to the substrate, the tank is disassembled and the substrate is dried during a drying step.

3. A method of formation of nanowires according to claim 1, in which, with the fluid being air which fills the tank, the metal nanoparticles are introduced into the tank using an atomiser and, provided at least one metal nanoparticle is attached on the substrate, the tank is disassembled.

4. A method of formation of nanowires according to claim 1, in which the metal nanoparticle is attached by fusion to the surface of the substrate.

5. A method of formation of nanowires according to claim 1, in which the substrate is previously covered with a surface treatment to facilitate attachment of the trapped metal nanoparticle to the substrate.

6. A method of formation of nanowires according to claim 5, in which the surface treatment is a treatment with poly-L-lysine or a treatment by aminosilane.

7. A method of formation of nanowires according to claim 6, in which the surface treatment is removed before the growing the nanowires.

8. A method of formation of nanowires according to claim 6, in which the surface treatment is removed after the growing the nanowires.

9. A method of formation of nanowires according to claim 5, in which the surface treatment is removed before the growing the nanowires.

10. A method of formation of nanowires according to claim 5, in which the surface treatment is removed after the growing the nanowires.

11. A method of manufacture of an optical component including a solid immersion lens and at least one nanowire coupled to the solid immersion lens, the method comprising:
    forming the at least one nanowire on a flat face of the solid immersion lens,
    wherein the forming the at least one nanowire is accomplished using the method of accordance with claim 1.

* * * * *